United States Patent
Russell et al.

(10) Patent No.: US 7,414,449 B2
(45) Date of Patent: Aug. 19, 2008

(54) DYNAMIC SCANNABLE LATCH AND METHOD OF OPERATION

(75) Inventors: Andrew C. Russell, Austin, TX (US); Jingfang Hao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 38 days.

(21) Appl. No.: 11/538,639

(22) Filed: Oct. 4, 2006

(65) Prior Publication Data

US 2008/0084235 A1    Apr. 10, 2008

(51) Int. Cl.
*H03K 3/00* (2006.01)
(52) U.S. Cl. ..................................... 327/218; 327/199
(58) Field of Classification Search .............. 327/199, 327/200, 218
See application file for complete search history.

(56) References Cited

U.S. PATENT DOCUMENTS

| 6,272,654 | B1 | 8/2001 | Freiburger |
| 6,377,098 | B1 | 4/2002 | Rebeor |
| 6,697,929 | B1 | 2/2004 | Cherkauer et al. |
| 2005/0104133 | A1* | 5/2005 | Kanno et al. ............... 257/371 |
| 2007/0018706 | A1* | 1/2007 | Hirata ......................... 327/218 |

* cited by examiner

*Primary Examiner*—Kenneth B. Wells
*Assistant Examiner*—Ryan C Jager
(74) *Attorney, Agent, or Firm*—Robert L. King; James L. Clingan, Jr.

(57) ABSTRACT

A latch has a first mode in which the latch functions as a dynamic latch and a second mode in which the latch functions as a static latch. The latch has a feedback circuit that in turn has two parallel switchable loads. The first load is responsive to a data input signal of the latch in the first mode and disabled in the second mode. The second load is responsive to a clock signal in the second mode and disabled in the first mode. The switchable loads being in parallel provides for the ability to select the feedback that is better for the particular mode of operation. The first and second switchable loads can be optimized for the particular mode of operation that will use it.

19 Claims, 2 Drawing Sheets

DYNAMIC SCANNABLE LATCH AND METHOD OF OPERATION

FIELD OF THE INVENTION

The present invention relates generally to semiconductors, and more particularly to circuits that store information to be scanned for test.

BACKGROUND OF THE INVENTION

During debug or a test of a semiconductor, engineers often take snapshots of a circuit that is under test. The snapshots provide insight into the current state of the device and may help to identify a problem by evaluating the data. In order to read out the values of circuit nodes, a circuit needs a way to send these values from latches or other storage devices in the circuit to the outside world. Scannable latches are often used. Previous scannable latches have used a plurality of clock signals to clock data and to implement the scan function. A disadvantage of the prior scannable latches is that the use of multiple clocks requires more power to implement and more signal conductors. Therefore, the implementation of scannable latches was inefficient either from power or size standpoints, or both. Additionally, in integrated circuits that have only a single clock, such multiple clock scannable latches are not useful.

Additionally, known latch circuits typically require careful transistor sizing in order to ensure reliable updating of values in the latch. Without the proper transistor size ratios, a new data value that is opposite from a previously stored value may not be reliably stored.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
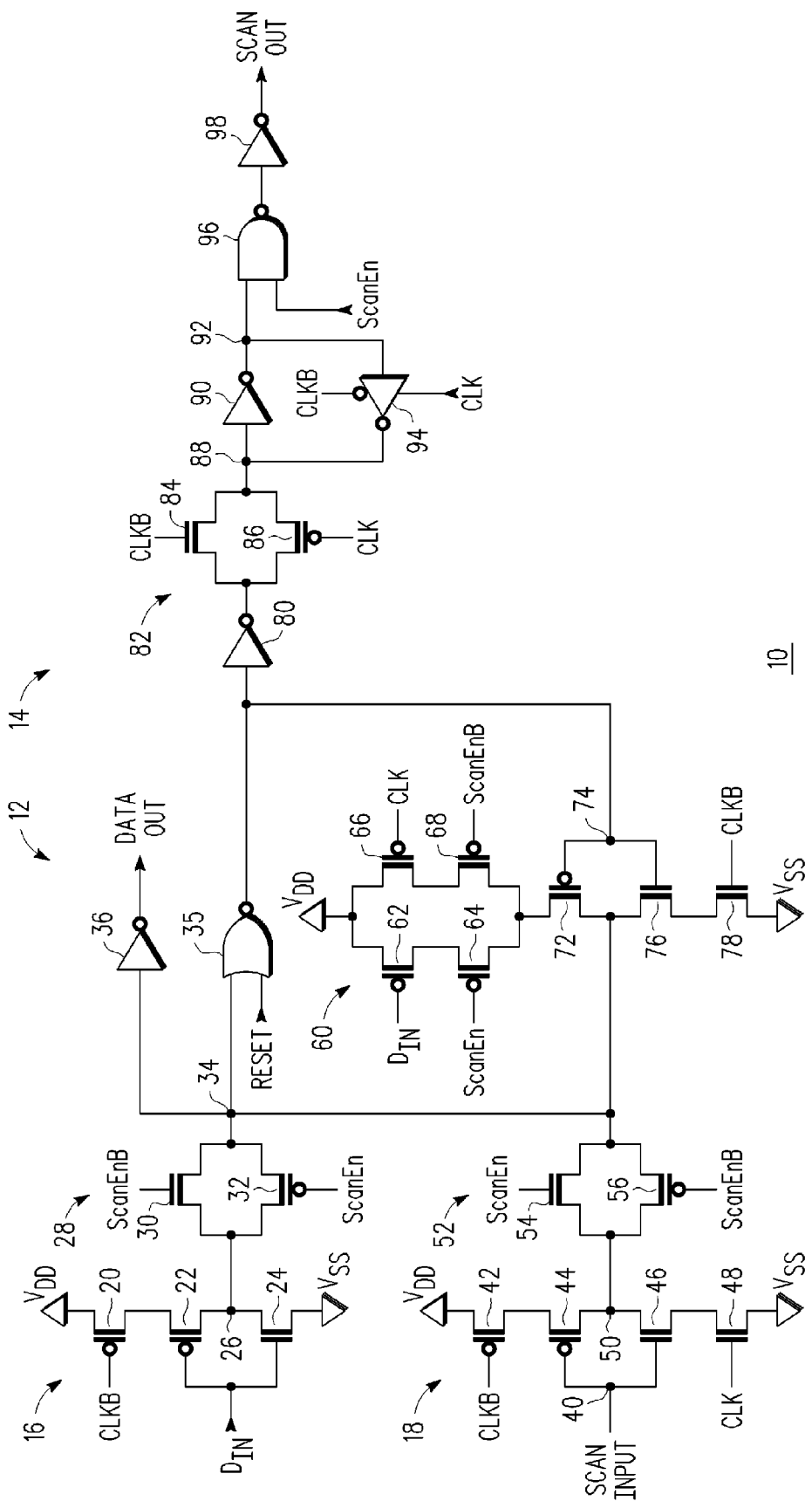
FIG. 1 illustrates in schematic form a latch circuit in accordance with one form of the present invention.

FIG. 1 illustrates a dynamic scannable latch circuit 10 that uses a single clock for functional and scan modes and that has feedback keeper storage circuitry that is conditioned by the selection of either a dynamic data port or a static scan port. Generally, the dynamic scannable latch circuit 10 has a master portion 12 and a slave portion 14. Within the master portion are a dynamic port 16 and a static port 18. In the dynamic port 16 a P-channel transistor 20 has a source connected to a power supply terminal for receiving a power supply voltage labeled $V_{DD}$. A gate of transistor 20 is provided for receiving a complement of a clock signal, labeled CLKB. A drain of transistor 20 is connected to a source of a P-channel transistor 22. A gate of transistor 22 is connected to a gate of an N-channel transistor 24 for receiving a dynamic data input signal labeled $D_{in}$. A drain of transistor 22 is connected to a drain of transistor 24 at a node 26. A source of transistor 24 is connected to a power supply terminal for receiving a reference voltage labeled $V_{SS}$. In one form the voltage $V_{SS}$ is a ground reference. A CMOS (complementary metal oxide semiconductor) transmission gate 28 has a first terminal connected to node 26 and a second terminal connected to a storage node 34. The CMOS transmission gate 28 has an N-channel transistor 30 having a source connected to node 26, a gate for receiving a complement of a scan enable signal, labeled ScanEnB, and a drain connected to the storage node 34. A P-channel transistor 32 has a source connected to the node 26, a gate for receiving a scan enable signal, labeled ScanEn, and a drain connected to the storage node 34. The second terminal of the CMOS transmission gate 28 is connected to a first input of a logic NOR gate 35. A second input of the NOR gate 35 is connected to a reset signal labeled Reset. An input of an inverter 36 is connected to the storage node 34. An output of inverter 36 provides an output signal for data, labeled Data Out.

Static port 18 has a P-channel transistor 42 having a source connected to a terminal for receiving the $V_{DD}$ power supply voltage. A gate of transistor 42 receives a complement of a clock signal labeled CLKB. A drain of transistor 42 is connected to a source of a P-channel transistor 44. A gate of transistor 44 is connected to a node 40 for receiving a Scan Input signal. A drain of transistor 44 is connected to a drain of an N-channel transistor 46 at a node 50. A gate of transistor 46 is connected to the gate of transistor 44 at the node 40. A source of transistor 46 is connected to a drain of an N-channel transistor 48. A gate of transistor 48 is connected to a clock signal labeled CLK. A source of transistor 48 is connected to a power supply terminal for receiving the $V_{SS}$ reference voltage. A CMOS transmission gate 52 has an N-channel transistor 54 having a first terminal connected to node 50. A second terminal of CMOS transmission gate 52 is connected to the storage node 34. CMOS transmission gate 52 has an N-channel transistor 54 having a source connected to node 50, a gate for receiving the scan enable signal, ScanEn, and a drain connected to node 34. CMOS transmission gate 52 has a P-channel transistor 56 with a source connected to the node 50, a gate for receiving the complement of the scan enable signal, ScanEnB, and a drain connected to node 34.

A feedback keeper circuit 60 has a P-channel transistor 62 having a source connected to a terminal for receiving the power supply voltage $V_{DD}$. A gate of transistor 62 receives the input data, $D_{IN}$. A drain of transistor 62 is connected to a source of a P-channel transistor 64. A gate of transistor 64 receives the scan enable signal ScanEn. A drain of transistor 64 is connected to a source of a P-channel transistor 72. A source of a P-channel transistor 66 is connected to the terminal for receiving the power supply voltage $V_{DD}$. A gate of transistor 66 is connected to the clock signal CLK. A drain of transistor 66 is connected to a source of a P-channel transistor 68. A gate of transistor 68 is connected to the complement of the scan enable signal, ScanEnB. A drain of transistor 68 is connected to the drain of transistor 64 and to the source of transistor 72. Transistors 62 and 64 function as a first switchable load. Transistors 66 and 68 function as a second switchable load. A gate of transistor 72 is connected to a node 74 and to a gate of an N-channel transistor 76. A drain of transistor 76 is connected to a drain of transistor 72 at the storage node 34. A source of transistor 76 is connected to a drain of an N-channel transistor 78. A gate of transistor 78 is connected to a terminal for receiving the complement of the clock signal, ClkB. A source of transistor 78 is connected to the reference supply voltage terminal for receiving $V_{SS}$.

Within the slave portion 14 is an inverter having an input connected to the output of NOR gate 35. An output of inverter 80 is connected to a CMOS transmission gate 82. The CMOS transmission gate 82 has an N-channel transistor 84 having a source connected to the output of inverter 80. A gate of transistor 84 is connected to a terminal for receiving a complement of the clock signal, ClkB. A drain of transistor 84 is connected to a node 88. The CMOS transmission gate 82 also has a P-channel transistor 86 having a source connected to the output of inverter 80. A gate of transistor 86 is connected to a terminal for receiving the clock signal, CLK. A drain of transistor 86 is connected to node 88. An input of an inverter 90 is connected to node 88. An output of inverter 90 is connected to an input of a tri-stated inverter 94 at a node 92. An output of tri-stated inverter 94 is connected to node 88. A first control terminal of tri-stated inverter 94 that is active low is connected to the complement of the clock signal, CLKB, and a second control terminal of tri-stated inverter 94 that is active high is connected to the clock signal, CLK. A logic NAND gate 96 has a first input connected to node 92, a second input for receiving the scan enable signal, ScanEn, and an output connected to an input of an inverter 98. An output of inverter 98 provides a scan output signal, SCAN OUT.

In operation, the dynamic scannable latch circuit 10 has a functional mode and a scan mode of operation in addition to a reset mode which occurs when the RESET signal is high. During the reset mode the clock signal is a low value and the scan enable signal is at a high value. The reset mode allows the feedback keeper circuit 60 to force a predetermined logic value of one onto storage node 34. During the reset mode of operation the transmission gate 82 is conductive to reset node 88 to a logic one. As a result, the Scan Out signal is a predetermined zero value during the reset mode of operation.

In the functional mode information that is present at the scan input is blocked from the storage node 34 by the signaling applied to CMOS transmission gate 52. In other words the scan enable signal is not asserted and thus transistors 54 and 56 are nonconductive. Similarly, the CMOS transmission gate 28 is conductive as a result of the values of the scan enable signal and complement thereof making transistors 30 and 32 conductive. The dynamic port 16, CMOS transmission gate 28, NOR gate 35, inverter 36 and feedback keeper circuit 60 function in this mode as a dynamic latch.

Figure 2:
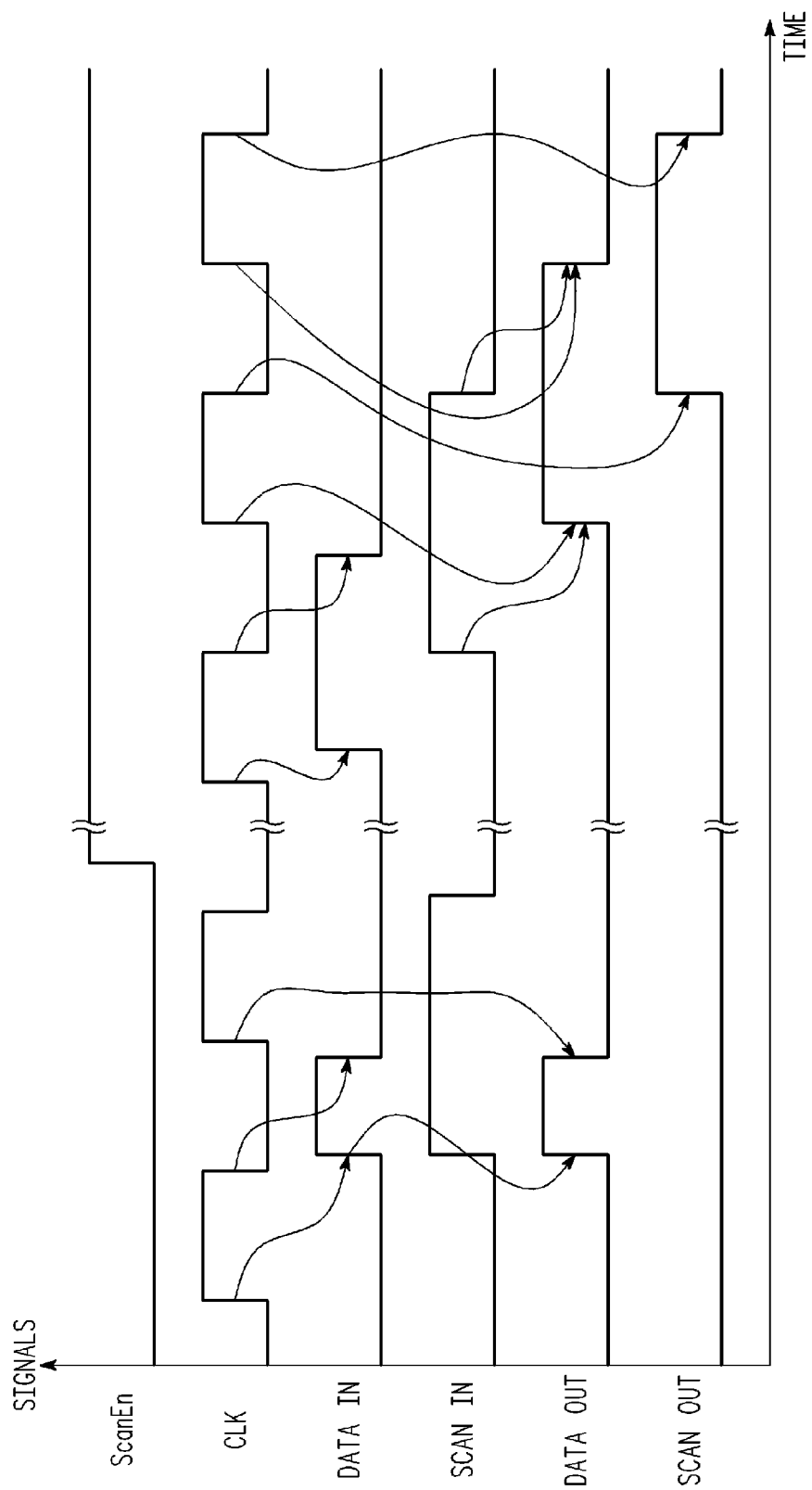
FIG. 2 illustrates in signal diagram form signals associated with the operation of FIG. 1.

The data input $D_{IN}$ is a dynamic signal meaning that the data input is a signal that operates in two distinct phases in response to the clock signal. The data input signal precharges to a logic value during a precharge phase of the clock signal. For the exemplary signals of FIG. 2 which are described below, the Data In signal will precharge in response to the clock signal transitioning to a logic low. The $D_{IN}$ data input either remains at the precharge value or transitions to an opposite logic value during an evaluate phase of the clock cycle which is when the clock signal is a logic high. It should be understood that logic values that are the reverse of what is illustrated in FIG. 2 may be readily implemented.

In the functional mode, assuming that $D_{IN}$ is a logic high input signal, node 26 and node 34 are a logic low regardless of whether the clock signal, CLK, is high or low. The output of inverter 36 which is the data output is a logic high. When the input data signal $D_{IN}$ is a logic low, the logic value of node 26 and node 34 depends upon whether the clock signal is high or low. If the clock signal is high, the node 34 assumes the opposite value of $D_{IN}$ which in this example is a high value. Also, the pull down stack of feedback keeper circuit 60 is disabled by making transistor 78 nonconductive. If the clock signal is low, storage node 34 will keep its value either through the conduction of transistors 62, 64 and 72 or through the conduction of transistors 76 and 78.

In the scan mode, the CMOS transmission gate 28 blocks the input data, $D_{IN}$, from storage node 34. Similarly, CMOS transmission gate 52 is made conductive by the scan enable, ScanEn, and complement, ScanEnB, signals to place the inverse of the Scan Input signal on storage node 34. When the clock is high, the feedback keeper circuit 60 is off or disabled as transistors 64, 66 and 78 are nonconductive. Scan-in data is therefore placed on node 34 without fighting any potentially opposite logic signal from the feedback path of node 74. When the clock is low, the feedback keeper circuit 60 is enabled through either transistors 66, 68 and 72 or through transistors 76 and 78, depending upon the logic value of the storage node 34 which determines the logic value of node 74.

In the scan mode, the scan value at node 34 is inverted four times in slave portion 14 prior to being output at the Scan Out terminal. The value of the Scan Out is determined by the value at node 74 and thus the output value of slave portion 14 is dependent upon the value generated by master portion 12. The four inversions within slave portion 14 are generated by inverter 80, inverter 90, NAND gate 96 and inverter 98. In the scan mode, transmission gate 82 selectively passes the scan data in the illustrated form only when the clock is low. NAND gate 96 conditions providing the Scan Out signal based upon assertion of the Scan Enable signal. Inverters 90 and 94 function as a storage mechanism wherein inverter 94 may be tristated (i.e. put in a high impedance state and thus not driving a signal) in response to the clock signal. From the description of the operation of FIG. 1 it can be seen that a reliable, dynamic scannable latch that uses the same clock for scan and functional modes is provided. The latch is dynamic because in the functional mode the data input will always be captured and stored on a rising edge regardless of what point in time the rising edge occurs. Thus predetermined edges of the data are captured dynamically. When in the scan mode of operation, the dynamic scannable latch circuit 10 is a static storage device because the scan input is a static signal. A multiplexing operation is performed wherein the CMOS transmission gate 28 and CMOS transmission gate 52 effectively share the feedback keeper circuit 60 between a data input port and a scan input port. Because the single clock signal and its complement are used to disable and enable the feedback keeper circuit 60, the feedback keeper circuit 60 does not have to be overpowered to update the dynamic scannable latch circuit 10 with a value opposite from what the feedback keeper circuit 60 is currently reinforcing.

Reference to a further example of the operation of the dynamic scannable latch circuit 10 will enhance understanding of the functioning of the circuitry. Illustrated in FIG. 2 are waveforms for an example operation. It should be understood that many other circuit conditions may exist. Assume initially that the functional mode of operation of the dynamic scannable latch circuit 10 exists as determined by the inactive state of the scan enable signal, ScanEn. Also assume that the single clock signal is transitioning between high and low levels. In the functional mode of operation a dynamic latch exists which means that digital data may be input at any point in time in a dynamic manner. When the clock signal is low, assume that the late arriving data input transitions to a logic high. The point in time when the data input transitions to a logic high depends on the propagation delay associated with logic circuitry (not shown) that is diving the data input signal. The low-to-high edge transition of the data input signal results in the near concurrent outputting of data because transistor 24 is biased on and CMOS transmission gate 28 is conductive. Assume that the data input value transitions back to a low level prior to the low-to-high transition of the clock signal. The low-to-high transition of the clock signal causes the data output signal to transition back to a low level. It should be noted that in the functional mode of operation the presence of input scan information does not affect the scan output signal or the data output signal.

As illustrated in FIG. 2 assume that after some time has elapsed, as indicated by the break in signal lines, that the scan mode of operation is entered with the assertion of the scan enable signal. When in the scan mode of operation, the presence of input data does not result in the outputting of that data. It should be noted that for the first low-to-high clock transition when the scan mode is enabled that the data input signal transitions to a high quicker than in the first illustrated data transition. The reason for the different transition time is due to a different logic delay path driving the data input than before. The different logic delay path has fewer levels of logic than the logic delay path that was initially providing the data. Thus a different propagation delay exists resulting in the data input signal transitioning quicker the second time than the first.

Additionally, assume that scan information is received as indicated by the transitioning of the scan in signal from a logic low level to a logic high level. On the next low-to-high edge transition of the clock signal, the data output signal will provide the scan information. This information may or may not be used. On the next high-to-low edge transition of the clock signal the scan output provides the scan information. The delay is a result of the propagation of the scan information through the slave portion 14. Also assume that the scan input information transitions back to a logic low signal. On the next low-to-high transition of the clock signal, the data output terminal transitions back to a logic low signal. Information representing the output signal is available but is a logic low or zero value. At the immediately following high-to-low transition of the clock signal the scan output clock signal transitions back to a low logic signal. Therefore, the dynamic scannable latch circuit 10 efficiently transitions between a functional mode of operation and a scan mode of operation via the scan enable signal.

By now it should be appreciated that there has been provided a circuit and method to latch either static scan information or dynamic input data with a single clock signal. A feedback keeper circuit is used whose behavior is conditioned on the type of input port (e.g. dynamic input or static input) that is used. Additionally, the dynamic input can actively toggle without affecting the operation of the latch during the scan mode.

In the foregoing specification, the invention has been described with reference to specific embodiments. However, one of ordinary skill in the art appreciates that various modifications and changes can be made without departing from the scope of the present invention as set forth in the claims below. For example the circuit of FIG. 1 can be reconfigured to capture late arriving data zero values rather than late arriving data one values when in the functional mode of operation. In such an implementation the dynamic port 16 is modified to reverse the conductivities of the transistors and reverse the logic value of the clock signal. For example, transistor 20 would be connected below the inverting pair of transistors 22 and 24 as an N-channel transistor and be controlled by the clock signal rather than the complement of the clock signal. The source of transistor 20 would be connected $V_{SS}$ and the source of transistor 22 would be connected to $V_{DD}$. Similarly, the feedback keeper circuit 60 would be reversed by changing transistors 62, 64, 66, 68 and 72 to N-channel transistors and transistors 76 and 78 to P-channel transistors. The sources of transistors 62 and 66 would be connected to $V_{SS}$ and the source of transistor 78 would be connected to $V_{DD}$. The gate of N-channel transistor 66 would be controlled by the complement of the Clock signal and the gate of P-channel transistor 78 would be controlled by the Clock signal. The gate of transistor 68 would be controlled by the scan enable (ScanEn) signal and the gate of transistor 64 would be controlled by the complement of the scan enable (ScanEnB) signal.

Other modifications to the dynamic scannable latch circuit 10 may be readily implemented. For example, other functions of the scan input may be implemented. The other functions may include other test-related functions or different functional modes of operation not connected with a test mode of operation. Additionally, various types of transistors may be implemented in addition to CMOS including but not limited to bipolar and GaAs transistors.

In one form there is provided a circuit having a first input circuit having an input for receiving a first input signal and having an output. A second input circuit has an input for receiving a second input signal and an output. An inverting circuit has an input coupled to the outputs of the first and second input circuits. A feedback circuit has an input coupled to the output of the inverting circuit and an output coupled to the outputs of the first and second input circuits. The feedback circuit includes a first transistor having a control terminal coupled to the output of the inverting circuit, a first current electrode coupled to a first power supply terminal, and a second current electrode coupled to the outputs of the first and second input circuits. The feedback circuit also includes a first switchable load, coupled between the second current electrode of the first transistor and a second power supply terminal, responsive to the first input signal in a first mode and disabled in a second mode. The feedback circuit also includes a second switchable load, in parallel with the first switchable load, responsive to a clock signal in the second mode and disabled in the first mode. In one form the feedback circuit further includes a second transistor. The first and second switchable loads are coupled to the second current electrode of the first transistor through the second transistor. The second transistor has a control electrode coupled to the output of the inverting circuit, a first current electrode coupled to the second current electrode of the first transistor, and a second current electrode coupled to the first and second switchable loads.

In another form the first switchable load includes a third transistor and a fourth transistor having current electrodes coupled in series between the second transistor and the second power supply terminal. The third transistor has a control electrode for receiving the first input signal. The fourth transistor has a control electrode for receiving a signal that causes the fourth transistor to be conductive in the first mode and non-conductive in the second mode. In another form the second switchable load includes a fifth transistor and a sixth transistor having current electrodes coupled in series between the second transistor and the second power supply terminal. The fifth transistor has a control electrode for receiving the clock signal. The sixth transistor has a control electrode for receiving a signal that causes the sixth transistor to be conductive in the second mode and non-conductive in the first mode. In another form the first mode is a mode in which the circuit operates as a dynamic latch. The second mode is a mode in which the circuit operates as a static latch. In one form the first transistor is an N-channel transistor and the second, third, fourth, fifth, and sixth transistors are P-channel transistors. In another form the first switchable load includes a second and a third transistor having current electrodes coupled in series between the first transistor and the second power supply terminal. The second transistor has a control electrode for receiving the first input signal. The third transistor has a control electrode for receiving a signal that causes the third transistor to be conductive in the first mode and non-conductive in the second mode. In another form the second switchable load includes a second and a third transistor having current electrodes coupled in series between the first transistor and the second power supply terminal. The second transistor has a control electrode for receiving the clock signal and the third transistor has a control electrode for receiving a signal that causes the third transistor to be conductive in the second mode and non-conductive in the first mode. In another form there is provided a second transistor coupled in series with the first transistor wherein the first and second transistors are between the first power supply terminal and the output of the feedback circuit. In this form the second transistor is responsive to the clock signal. In another form the first and second transistors are N-channel transistors and the second transistor has a control electrode for receiving an inverse of the clock signal. In another form the first input circuit is responsive to the clock signal. In one form the first input circuit includes a clocked inverter having an inverter and a clocking transistor coupled to the inverter having a control electrode responsive to the clock signal. In another form the second input circuit is responsive to the clock signal. In yet another form the second input circuit includes a clocked inverter having an inverter having an input as the input of the second input circuit and an output as the output of the second input circuit. A first clocking transistor is coupled between the inverter and the first power supply terminal, for receiving the clock signal. In another form a second clocking transistor is coupled between the inverter and the second power supply terminal, for receiving an inverse of the clock signal. In yet another form the first input circuit is enabled during the first mode and disabled during the second mode. The second input circuit is enabled during the second mode and disabled during the first mode.

In another form there is provided a latch, wherein the latch has a dynamic latch mode in which the latch functions as a dynamic latch and a scan mode in which the latch functions as a static latch. The latch includes a feedback circuit, wherein the feedback circuit has two parallel loads in which a first load of the two parallel loads is responsive to a data input signal of the latch in the dynamic latch mode and is disabled in the scan mode. A second load of the two parallel loads is responsive to a clock signal in the second mode and is disabled in the first mode. In one form the latch further includes a first input circuit, enabled during the dynamic latch mode and disabled during the scan mode, and has an input for receiving the data input signal and an output coupled to an output of the feedback circuit. A second input circuit, disabled during the dynamic latch mode and enabled during the scan mode, has an input for receiving a scan input signal and an output coupled to the output of the feedback circuit. An inverting circuit has an input coupled to the output of the first input circuit and second input circuit and has an output coupled to an input of the feedback circuit. In one form the latch circuit includes a slave latch wherein the slave latch has an input coupled to the output of the inverting circuit. The slave latch has an output that is enabled during the scan mode and disabled during the dynamic latch mode.

In another form there is provided a method for operating a latch. A storage node is provided in the latch. Input data is provided on the storage node during a first phase of a clock signal while preventing scan data from reaching the storage node during a first mode of operation. A feedback circuit is provided having a first load and a second load in which the first and second loads are in parallel. The first load is enabled to be responsive to the input data during the first mode of operation. The second load is disabled during the first mode of operation. Scan data is provided on the storage node during the first phase of the clock signal while preventing input data from reaching the storage node during a second mode of operation. The second load is enabled to be responsive to the clock signal during the second mode of operation. The first load is disabled during the second mode of operation. In one form the providing of input data further includes allowing a change from a first logic state to a second logic state but not from the second logic state to the first logic state on the storage node during a second phase of the clock signal during the first mode of operation. In another form the enabling of the second load further includes causing the scan data on the storage node to be unchanged during a second phase of the clock signal during the second mode of operation.

Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. Unless expressly indicated otherwise, terms such as "first" and "second" are used to arbitrarily distinguish between the elements such terms describe. Thus, these terms are not necessarily intended to indicate temporal or other prioritization of such elements. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A circuit, comprising:
    a first input circuit having an input for receiving a first input signal and having an output;
    a second input circuit having an input for receiving a second input signal and having an output;
    an inverting circuit having an input coupled to the outputs of the first and second input circuits; and
    a feedback circuit having an input coupled to an output of the inverting circuit and an output coupled to the outputs of the first and second input circuits;
    wherein the feedback circuit comprises:
        a first transistor having a control terminal coupled to the output of the inverting circuit, a first current electrode coupled to a first power supply terminal, and a second current electrode coupled to the outputs of the first and second input circuits;
        a first switchable load, coupled between the second current electrode of the first transistor and a second power supply terminal, responsive to the first input signal in a first mode and disabled in a second mode;

a second switchable load, in parallel with the first switchable load, responsive to a clock signal in the second mode and disabled in the first; and a second transistor that couples the first and second switchable loads to the second current electrode of the first transistor, the second transistor having a control electrode coupled to the output of the inverting circuit, a first current electrode coupled to the second current electrode of the first transistor, and a second current electrode coupled to the first and second switchable loads.

2. The circuit of claim 1, wherein the first switchable load comprises a third transistor and a fourth transistor having current electrodes coupled in series between the second transistor and the second power supply terminal, wherein:

the third transistor has a control electrode for receiving the first input signal; and the fourth transistor has a control electrode for receiving a signal that causes the fourth transistor to be conductive in the first mode and non-conductive in the second mode.

3. The circuit of claim 2, wherein the second switchable load comprises a fifth transistor and a sixth transistor having current electrodes coupled in series between the second transistor and the second power supply terminal, wherein:

the fifth transistor has a control electrode for receiving the clock signal; and the sixth transistor has a control electrode for receiving a signal that causes the sixth transistor to be conductive in the second mode and non-conductive in the first mode.

4. The circuit of claim 3, wherein:

the first mode is a mode in which the circuit operates as a dynamic latch;

the second mode is a mode in which the circuit operates as a static latch;

the first transistor is an N-channel transistor; and the second, third, fourth, fifth, and sixth transistors are P-channel transistors.

5. The circuit of claim 1, wherein the first switchable load comprises a second and a third transistor having current electrodes coupled in series between the first transistor and the second power supply terminal, wherein:

the second transistor has a control electrode for receiving the first input signal; and the third transistor has a control electrode for receiving a signal that causes the third transistor to be conductive in the first mode and non-conductive in the second mode.

6. The circuit of claim 1, wherein the second switchable load comprises a second and a third transistor having current electrodes coupled in series between the first transistor and the second power supply terminal, wherein:

the second transistor has a control electrode for receiving the clock signal; and the third transistor has a control electrode for receiving a signal that causes the third transistor to be conductive in the second mode and non-conductive in the first mode.

7. The circuit of claim 1, further comprising a second transistor coupled in series with the first transistor, wherein:

the first and second transistors are between the first power supply terminal and the output of the feedback circuit; and the second transistor is responsive to the clock signal.

8. The circuit of claim 7, wherein the first and second transistors are N-channel transistors and the second transistor has a control electrode for receiving an inverse of the clock signal.

9. The circuit of claim 1, wherein the first input circuit is responsive to the clock signal.

10. The circuit of claim 9, wherein the first input circuit comprises:

a clocked inverter comprising an inverter and a clocking transistor coupled to the inverter having a control electrode responsive to the clock signal.

11. The circuit of claim 1, wherein the second input circuit is responsive to the clock signal.

12. The circuit of claim 9, wherein the second input circuit comprises a clocked inverter, comprising:

an inverter having an input as the input of the second input circuit and an output as the output of the second input circuit;

a first clocking transistor, coupled between the inverter and the first power supply terminal, for receiving the clock signal; and a second clocking transistor, coupled between the inverter and the second power supply terminal, for receiving an inverse of the clock signal.

13. The circuit of claim 1, wherein:

the first input circuit is enabled during the first mode and disabled during the second mode; and the second input circuit is enabled during the second mode and disabled during the first mode.

14. A latch for storing information at a storage node, wherein the latch has a dynamic latch mode in which the latch functions as a dynamic latch and a scan mode in which the latch functions as a static latch, wherein the latch comprises a feedback circuit, wherein the feedback circuit comprises two parallel loads in which a first load of the two parallel loads is responsive to a data input signal of the latch in the dynamic latch mode and disabled in the scan mode, and a second load of the two parallel loads is responsive to a clock signal in the scan mode and disabled in the dynamic latch mode, the two parallel loads coupled in series with series-connected first and second transistors that are connected together at the storage node, the first and second transistors being of opposite conductivity type and each having a control electrode connected to an output of a logic gate having an input connected to the storage node.

15. The latch of claim 14, wherein the latch is further characterized as comprising:

a first input circuit, enabled during the dynamic latch mode and disabled during the scan mode, having an input for receiving the data input signal and an output coupled to an output of the feedback circuit;

a second input circuit, disabled during the dynamic latch mode and enabled during the scan mode, having an input for receiving a scan input signal and an output coupled to the output of the feedback circuit; and an inverting circuit having an input coupled to the output of the first input circuit and second input circuit and an output coupled to an input of the feedback circuit.

16. The latch of claim 15, further comprising a slave latch, wherein:

the slave latch has an input coupled to the output of the inverting circuit; and the slave latch has an output that is enabled during the scan mode and disabled during the dynamic latch mode.

17. A method for operating a latch, comprising:

providing a storage node in the latch;

providing input data on the storage node during a first phase of a clock signal while preventing scan data from reaching the storage node during a first mode of operation;

providing a feedback circuit having a first load and a second load in which the first and second loads are in parallel and coupled in series with series-connected first and second transistors that are connected together at the storage node, the first and second transistors being of opposite conductivity type and each having a control electrode connected to an output of a logic gate having an input connected to the storage node;

enabling the first load to be responsive to the input data during the first mode of operation;

disabling the second load during the first mode of operation;

providing scan data on the storage node during the first phase of the clock signal while preventing input data from reaching the storage node during a second mode of operation:

enabling the second load to be responsive to the clock signal during the second mode of operation; and disabling the first load during the second mode of operation.

18. The method of claim 17, wherein the step of providing input data is further characterized by allowing a change from a first logic state to a second logic state but not from the second logic state to the first logic state on the storage node during a second phase of the clock signal during the first mode of operation.

19. The method of claim 17, wherein the step of enabling the second load is further characterized by causing the scan data on the storage node to be unchanged during a second phase of the clock signal during the second mode of operation.

* * * * *

UNITED STATES PATENT AND TRADEMARK OFFICE
CERTIFICATE OF CORRECTION

| | | |
|---|---|---|
| PATENT NO. | : 7,414,449 B2 | Page 1 of 1 |
| APPLICATION NO. | : 11/538639 | |
| DATED | : August 19, 2008 | |
| INVENTOR(S) | : Russell et al. | |

It is certified that error appears in the above-identified patent and that said Letters Patent is hereby corrected as shown below:

Column 9, line 3, in claim 1, delete "first;" and insert -- first mode; --.

Column 11, line 17, in claim 17, delete "operation:" and insert -- operation; --.

Signed and Sealed this
Twelfth Day of July, 2011

David J. Kappos
*Director of the United States Patent and Trademark Office*